US012808940B2

(12) United States Patent
Ma et al.

(10) Patent No.: US 12,808,940 B2

(45) Date of Patent: Nov. 24, 2026

(54) ON-LINE MEASUREMENT SYSTEM OF ALTERNATING CURRENT IMPEDANCE OF VEHICLE-MOUNTED FUEL CELL AND METHOD THEREOF

(71) Applicant: Tongji University, Shanghai (CN)

(72) Inventors: Tiancai Ma, Shanghai (CN); Xinru Xu, Shanghai (CN); Weikang Lin, Shanghai (CN); Yanbo Yang, Shanghai (CN)

( * ) Notice: Subject to any disclaimer, the term of this patent is extended or adjusted under 35 U.S.C. 154(b) by 595 days.

(21) Appl. No.: 18/375,368

(22) Filed: Sep. 29, 2023

(65) Prior Publication Data

US 2024/0369641 A1 Nov. 7, 2024

(30) Foreign Application Priority Data

May 4, 2023 (CN) ........................ 202310486852.5

(51) Int. Cl.

*G01R 31/389* (2019.01)
*G01R 31/36* (2020.01)
*G01R 31/367* (2019.01)
*G01R 31/3842* (2019.01)
*G01R 31/392* (2019.01)

(52) U.S. Cl.

CPC ....... *G01R 31/389* (2019.01); *G01R 31/3648* (2013.01); *G01R 31/367* (2019.01); *G01R 31/3842* (2019.01); *G01R 31/392* (2019.01)

(58) Field of Classification Search

CPC ................ G01R 31/389; G01R 31/367; G01R 31/392; G01R 27/02; G01R 31/378
USPC ........................................................ 324/430
See application file for complete search history.

(56) References Cited

U.S. PATENT DOCUMENTS

| | | | | |
|---|---|---|---|---|
| 6,023,150 A * | 2/2000 | Patino | H02J 7/00 340/636.11 |
| 9,917,315 B2 * | 3/2018 | Aoki | H01M 8/04 |
| 9,989,595 B1 * | 6/2018 | Wang | G01R 31/3648 |

(Continued)

OTHER PUBLICATIONS

Land, Raul, et al. "Improvements in design of spectra of multisine and binary excitation signals for multi-frequency bioimpedance measurement." 2011 Annual International Conference of the IEEE Engineering in Medicine and Biology Society. IEEE, 2011. (Year: 2011).*

*Primary Examiner* — Christopher P McAndrew

(74) *Attorney, Agent, or Firm* — Derek Fahey, Esq.; The Plus IP Firm, PLLC

(57) ABSTRACT

An on-line measurement system of an alternating current impedance of a vehicle-mounted fuel cell and a method thereof are disclosed. The system includes an impedance measuring group including an alternating current exciting unit, a current sensor and an impedance inspecting unit; the alternating current exciting unit is configured to apply a multi-frequency composite sine wave excitation signal to a fuel cell stack; the current sensor is arranged on an output trunk of the fuel cell stack and configured to collect an output current of the fuel cell stack or a single fuel cell; the impedance inspecting unit is configured to collect an output voltage of the fuel cell stack or the single fuel cell, calculate a fuel cell impedance according to the output voltage and the output current, and identify a parameter of a pre-constructed fuel cell equivalent circuit model based on the calculated fuel cell impedance.

8 Claims, 8 Drawing Sheets

(56) References Cited

U.S. PATENT DOCUMENTS

| | | | | |
|---|---|---|---|---|
| 11,614,490 | B2 * | 3/2023 | Bryngelsson | G01R 31/367 702/63 |
| 2009/0226770 | A1 * | 9/2009 | Manabe | H01M 8/04947 429/431 |
| 2011/0115499 | A1 * | 5/2011 | Chodavarapu | G01R 27/02 324/649 |
| 2014/0372054 | A1 * | 12/2014 | Wang | G01R 31/3842 702/63 |
| 2014/0372055 | A1 * | 12/2014 | Wang | G01R 31/389 702/63 |
| 2016/0059727 | A1 * | 3/2016 | Lee | B60L 53/14 903/903 |
| 2017/0336479 | A1 * | 11/2017 | Busser | G01R 31/3648 |
| 2019/0339330 | A1 * | 11/2019 | Bryngelsson | G01R 31/367 |
| 2020/0209318 | A1 * | 7/2020 | Ballantine | H01M 10/482 |
| 2021/0011067 | A1 * | 1/2021 | Elsahwi | G01N 27/026 |
| 2022/0170388 | A1 * | 6/2022 | O'Donnell | F01K 3/02 |
| 2022/0263107 | A1 * | 8/2022 | Braunecker | H01M 8/04201 |

* cited by examiner

ON-LINE MEASUREMENT SYSTEM OF ALTERNATING CURRENT IMPEDANCE OF VEHICLE-MOUNTED FUEL CELL AND METHOD THEREOF

CROSS-REFERENCE TO RELATED APPLICATION

This patent application claims the benefit and priority of Chinese Patent Application No. 2023104868525 filed with the China National Intellectual Property Administration on May 4, 2023, the disclosure of which is incorporated by reference herein in its entirety as part of the present application.

TECHNICAL FIELD

The present disclosure relates to the technical field of fuel cell detection, in particular to an on-line measurement system of an alternating current impedance of a vehicle-mounted fuel cell and a method thereof.

BACKGROUND

In recent years, the energy crisis and environmental pollution have become increasingly serious, and countries around the world have begun to pay extensive attention to and study renewable energy sources. Among many renewable energy sources, hydrogen energy, as a clean secondary energy source, is regarded as one of the most likely energy sources to replace traditional fossil fuels in the future. As a carrier of hydrogen energy, a fuel cell has attracted wide attention because of its advantages of high efficiency and no pollution. However, the fuel cell still has problems such as insufficient reliability and poor durability, especially in some complex application scenarios, which may lead to various failures. These failures not only reduce the performance of the fuel cell, but also greatly shorten its service life. Therefore, it is very important to carry out real-time state monitoring and operation condition adjustment on the fuel cell to ensure the safe and stable operation of the fuel cell and improve the service life of the fuel cell.

Because of the structural characteristics of the fuel cell, it is difficult to directly measure its internal parameters, and it is difficult to monitor the state and diagnose the fault only by the single cell voltage and the indicators such as the temperature, humidity, pressure and flow rate of the stack port. The fuel cell impedance can be used as an indicator to indirectly reflect the changes of various parameters in the fuel cell, especially the on-line impedance spectrum data of the fuel cell at different excitation frequencies, which can provide a great deal of information about the state of the fuel cell. The parameters of the fuel cell equivalent circuit model are identified by the impedance spectrum, and the electrochemical behavior of the fuel cell is explained by a model parameter mechanism, which can make more accurate fault diagnosis of the fuel cell. However, the fault diagnosis technology based on electrochemical impedance spectrum is still mainly used in scientific research, but not widely used in vehicle-mounted fuel cell systems, mainly because of the following three shortcomings. First, the traditional electrochemical impedance spectrum measurement method takes a long time, often taking several minutes or even ten minutes. Second, at present, impedance spectrum measurement is mostly realized by special instruments and devices, which are bulky, expensive, precise and fragile, and difficult to be integrated into the vehicle-mounted fuel cell system. Third, the existing impedance data diagnosis and analysis methods mostly rely on the upper computer software, and lack of on-line diagnosis and analysis methods for impedance data, which cannot meet the application in vehicles.

SUMMARY

An objective of some embodiments of the present disclosure is to provide an on-line measurement system of an alternating current impedance of a vehicle-mounted fuel cell and a method thereof, which are used to solve the problems of long calculation time, large volume and inability to meet the application in vehicles of the fuel cell impedance measurement system in the prior art.

In order to achieve the above objective, the present disclosure provides the following technical solutions.

An on-line measurement system of an alternating current impedance of a vehicle-mounted fuel cell is provided, which includes an impedance measuring group; where the impedance measuring group includes:

- an alternating current exciting unit, configured to apply a multi-frequency composite sine wave excitation signal to a fuel cell stack; where the multi-frequency composite sine wave excitation signal is obtained by performing phase optimization and synthesis on sine wave signals with different frequencies;
- a current sensor, arranged on an output trunk of the fuel cell stack and configured to collect an output current of the fuel cell stack or a single fuel cell;
- an impedance inspecting unit, connected with the fuel cell stack and the current sensor, respectively, and configured to collect an output voltage of the fuel cell stack or the single fuel cell, calculate a fuel cell impedance according to the output voltage and the output current, and identify parameters of a pre-constructed fuel cell equivalent circuit model based on the calculated fuel cell impedance; where the fuel cell equivalent circuit model after parameter identification is configured to fit the fuel cell impedance.

Preferably, the on-line measurement system of the alternating current impedance of the vehicle-mounted fuel cell further includes a cloud computing platform in wireless communication with the impedance measuring group; the cloud computing platform is configured to receive and store the parameters of the fuel cell equivalent circuit model and the fitted fuel cell impedance; and based on the fitted fuel cell impedance, evaluate a health status and diagnose a fault of the fuel cell by using a clustering algorithm.

Preferably, the alternating current exciting unit includes:

- a Flash memory, configured to store the multi-frequency composite sine wave excitation signal;
- a sine pulse width modulation unit, connected with the Flash memory and configured to control an output of the multi-frequency composite sine wave excitation signal;
- a full-bridge topology circuit, connected with the sine pulse width modulation unit and configured to apply the output multi-frequency composite sine wave excitation signal to the fuel cell stack.

Preferably, the impedance inspecting unit includes:

- a relay switch, connected with the fuel cell stack and configured to select an inspecting channel and collect the output voltage of the fuel cell stack or the single fuel cell;
- a first differential amplifier, connected with an output end of the relay switch and configured to eliminate a common-mode voltage;

a second differential amplifier, connected with an output end of the current sensor and configured to eliminate a common-mode current;

an analog-to-digital converter, connected with an output end of the first differential amplifier and an output end of the second differential amplifier, respectively, and configured to convert an analog signal into a digital signal;

a digital signal processor, connected with an output end of the analog-to-digital converter and configured to calculate the fuel cell impedance according to the converted output voltage and output current, and identify the parameters of the pre-constructed fuel cell equivalent circuit model based on the calculated fuel cell impedance.

The present disclosure further provides an on-line measurement method of an alternating current impedance of a vehicle-mounted fuel cell, the method is applied to the on-line measurement system of the alternating current impedance of the vehicle-mounted fuel cells described above, including:

performing synthesis and phase optimization on sine wave signals with different frequencies to obtain a multi-frequency composite sine wave excitation signal;

constructing a fuel cell equivalent circuit model;

applying the multi-frequency composite sine wave excitation signal to a fuel cell stack, and collecting an output voltage and an output current of the fuel cell stack or a single fuel cell;

calculating a fuel cell impedance based on the output voltage and the output current;

identifying a parameter of the fuel cell equivalent circuit model based on the calculated fuel cell impedance;

fitting the fuel cell impedance by the fuel cell equivalent circuit model after parameter identification.

Preferably, after fitting the fuel cell impedance by the fuel cell equivalent circuit model after parameter identification, the method further includes:

storing the parameter of the fuel cell equivalent circuit model and the fitted fuel cell impedance; and based on the fitted fuel cell impedance, evaluating a health status and diagnosing a fault of the fuel cell by using a clustering algorithm.

Preferably, performing synthesis and phase optimization on sine wave signals with different frequencies to obtain a multi-frequency composite sine wave excitation signal specifically includes:

performing a composite process on sine wave signals with different frequencies;

for the composite sine wave signals, iteratively optimizing an initial phase by a global search algorithm, and determining a phase value of each frequency point that minimizes a crest factor CF as a final optimized phase value.

Preferably, the fuel cell equivalent circuit model is a second-order RC model, which consists of an ohmic resistor and two RC links connected in series.

Preferably, calculating a fuel cell impedance based on the output voltage and the output current specifically includes:

calculating the output voltage and the output current in real time through an orthogonal digital phase-lock amplifier, respectively, converting a time domain signal into a frequency domain signal, and obtaining a current amplitude and a current phase corresponding to the output current at different frequencies and a voltage amplitude and a voltage phase corresponding to the output voltage at different frequencies;

calculating fuel cell impedances at different frequencies based on the current amplitude, the current phase, the voltage amplitude and the voltage phase.

Preferably, identifying a parameter of the fuel cell equivalent circuit model based on the calculated fuel cell impedance specifically includes:

based on the calculated fuel cell impedance, calculating an initial value of the parameter of the fuel cell equivalent circuit model by an arc characteristic of an impedance spectrum curve;

based on the initial value of the parameter, identifying the parameter of the fuel cell equivalent circuit model by using a Nelder-Mead simplex algorithm.

According to the specific embodiment provided by the present disclosure, the present disclosure discloses the following technical effects.

(1) In the on-line measurement system of the alternating current impedance of the vehicle-mounted fuel cell according to the present disclosure, the impedance measuring group adopts an alternating current exciting unit without using DC/DC for excitation, and is small in size, economical, and suitable for a vehicle-mounted fuel cell system. The internal memory stores the predesigned multi-frequency composite sine wave excitation signal, which can realize the injection of excitation current without external control and is easy to operate.

(2) The on-line measurement system of the alternating current impedance of the vehicle-mounted fuel cell according to the present disclosure can freely adjust the frequency distribution of each single-frequency component by using the multi-frequency composite sine wave excitation signal, has lower requirements on excitation hardware, takes less time for impedance spectrum measurement and also ensures that the impedance data measured each time at different frequencies are at the same time.

BRIEF DESCRIPTION OF THE DRAWINGS

In order to explain the technical solutions in the embodiments of the present disclosure or in the prior art more clearly, the accompanying drawings required in the embodiments will be briefly introduced. Apparently, the accompanying drawings in the following description show only some embodiments of the present disclosure. For those skilled in the art, other drawings can be derived from these accompanying drawings without creative efforts.

DETAILED DESCRIPTION OF THE EMBODIMENTS

The technical solutions in the embodiments of the present disclosure will be clearly and completely described with reference to the drawings in the embodiments of the present disclosure hereinafter. Apparently, the described embodiments are only some embodiments, rather than all of the embodiments of the present disclosure. All other embodiments obtained by those skilled in the art based on the embodiments of the present disclosure, without creative efforts, shall fall within the scope of protection of the present disclosure.

An objective of some embodiments of the present disclosure is to provide an on-line measurement system of an alternating current impedance of a vehicle-mounted fuel cell and a method thereof, which are used to solve the problems of long calculation time, large volume and inability to meet the application in vehicles of the fuel cell impedance measurement system in the prior art.

In order to make the above objective, features and advantages of the present disclosure clearer and more comprehensible, the present disclosure will be explained in further detail with reference to the drawings and specific embodiments hereinafter.

Embodiment 1

Figure 1:
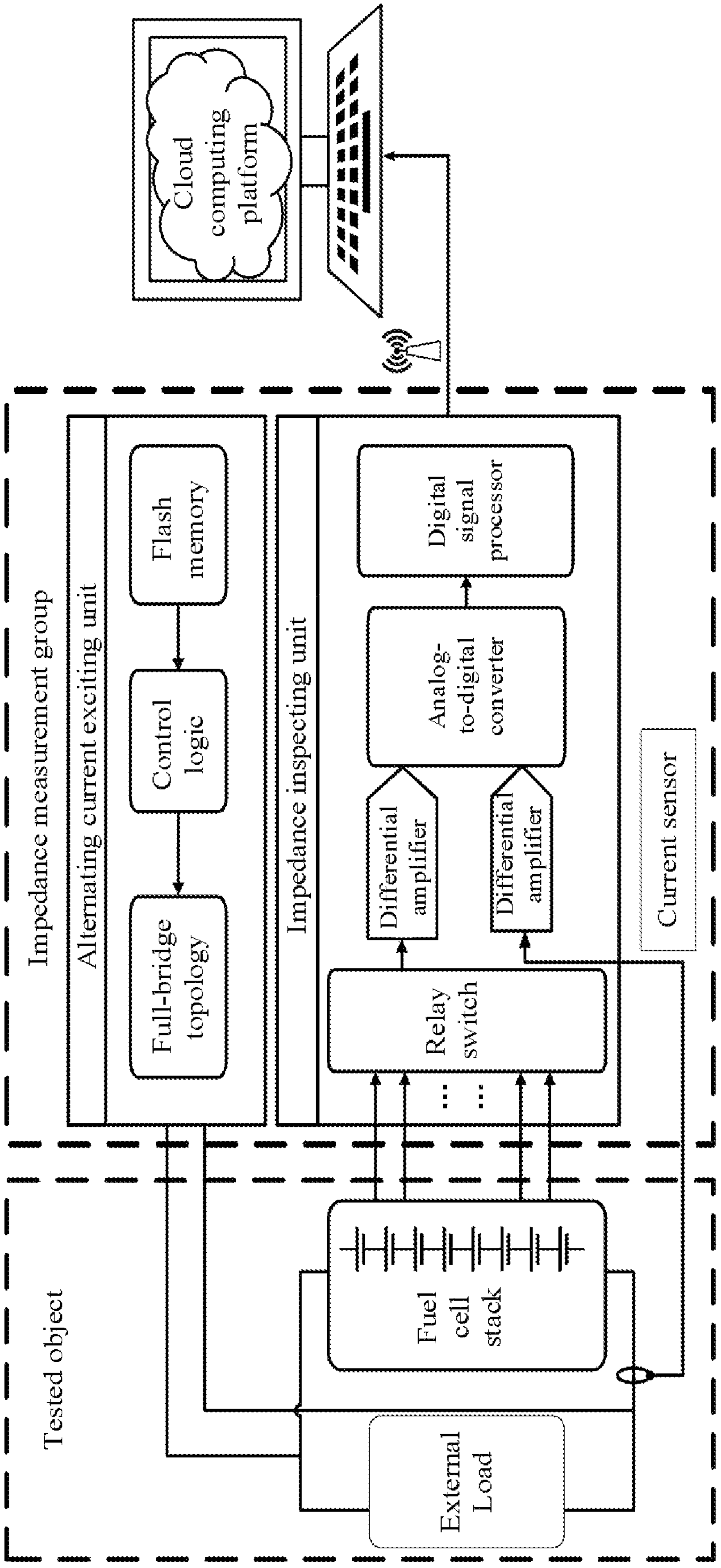
FIG. 1 is a schematic structure diagram of an on-line measurement system of an alternating current impedance of a vehicle-mounted fuel cell according to Embodiment 1 of the present disclosure.

As shown in FIG. 1, the on-line measurement system of the alternating current impedance of the vehicle-mounted fuel cells according to Embodiment 1 of the present disclosure includes an impedance measuring group and a cloud computing platform. The impedance measuring group includes an alternating current exciting unit, a current sensor and an impedance inspecting unit.

Further, the alternating current exciting unit is configured to apply a multi-frequency composite sine wave excitation signal to a fuel cell stack. The multi-frequency composite sine wave excitation signal is obtained by performing phase optimization and synthesis on sine wave signals with different frequencies.

The alternating current exciting unit can realize alternating current excitation injection without external DC/DC, uses a full-bridge topology circuit, and adjusts turn-on time of a switch tube by sine pulse width modulation (SPWM) to realize an output of the multi-frequency composite sine wave excitation signal. The alternating current exciting unit includes a Flash memory which is configured to store the synthesized and optimized multi-frequency composite sine wave excitation signal.

Further, the current sensor is arranged on an output trunk of the fuel cell stack and is configured to collect an output current of the fuel cell stack or a single fuel cell.

Further, the impedance inspecting unit is connected with the fuel cell stack and the current sensor, respectively, and is configured to collect an output voltage of the fuel cell stack or the single fuel cell, calculate a fuel cell impedance according to the output voltage and the output current, and identify a parameter of a pre-constructed fuel cell equivalent circuit model based on the calculated fuel cell impedance. The fuel cell equivalent circuit model after parameter identification is configured to fit the fuel cell impedance.

The impedance inspecting unit includes a relay switch configured to select an inspecting channel, differential amplifiers configured to eliminate a common-mode voltage and current, an analog-to-digital converter configured to convert an analog signal into a digital signal, and a digital signal processor configured for overall logic control of a controller, calculation of the fuel cell impedance, parameter identification of the fuel cell equivalent circuit model and external communication functions.

Further, the cloud computing platform receives the parameter of the equivalent circuit model and the fitted fuel cell impedance from the impedance inspecting unit in real time through wireless transmission. The cloud computing platform includes a wireless communication module for wireless communication with the impedance inspecting unit; a data preprocessing module for performing data preprocessing on the received calculation result of the impedance inspecting unit and monitoring an abnormal condition; a database for storing the preprocessed calculation result of the impedance inspecting unit; a data platform for managing health of the fuel cell and diagnosing a fault of the fuel cell by a clustering algorithm, and opening an algorithm deployment interface to provide a visual operating platform for data mining and application.

Compared with the prior art, the on-line measurement system of the alternating current impedance of the vehicle-mounted fuel cell according to the present disclosure has small size and good economy and is suitable for a vehicle-mounted fuel cell system because the impedance measuring group uses an alternating current exciting unit without using DC/DC for excitation. Meanwhile, the internal memory stores the pre-designed and optimized multi-frequency composite sine wave, which can realize the injection of excitation current without external control and is easy to operate. The impedance inspecting unit of the impedance measuring group can measure the impedance of a single fuel cell or a whole stack to meet different measurement requirements, and can identify the parameter of the fuel cell equivalent circuit model on-line based on the impedance data in real time. The cloud computing platform can evaluate the health status of the fuel cell and diagnose a fault of the fuel cell, and can expand more functions.

Embodiment 2

Figure 2:
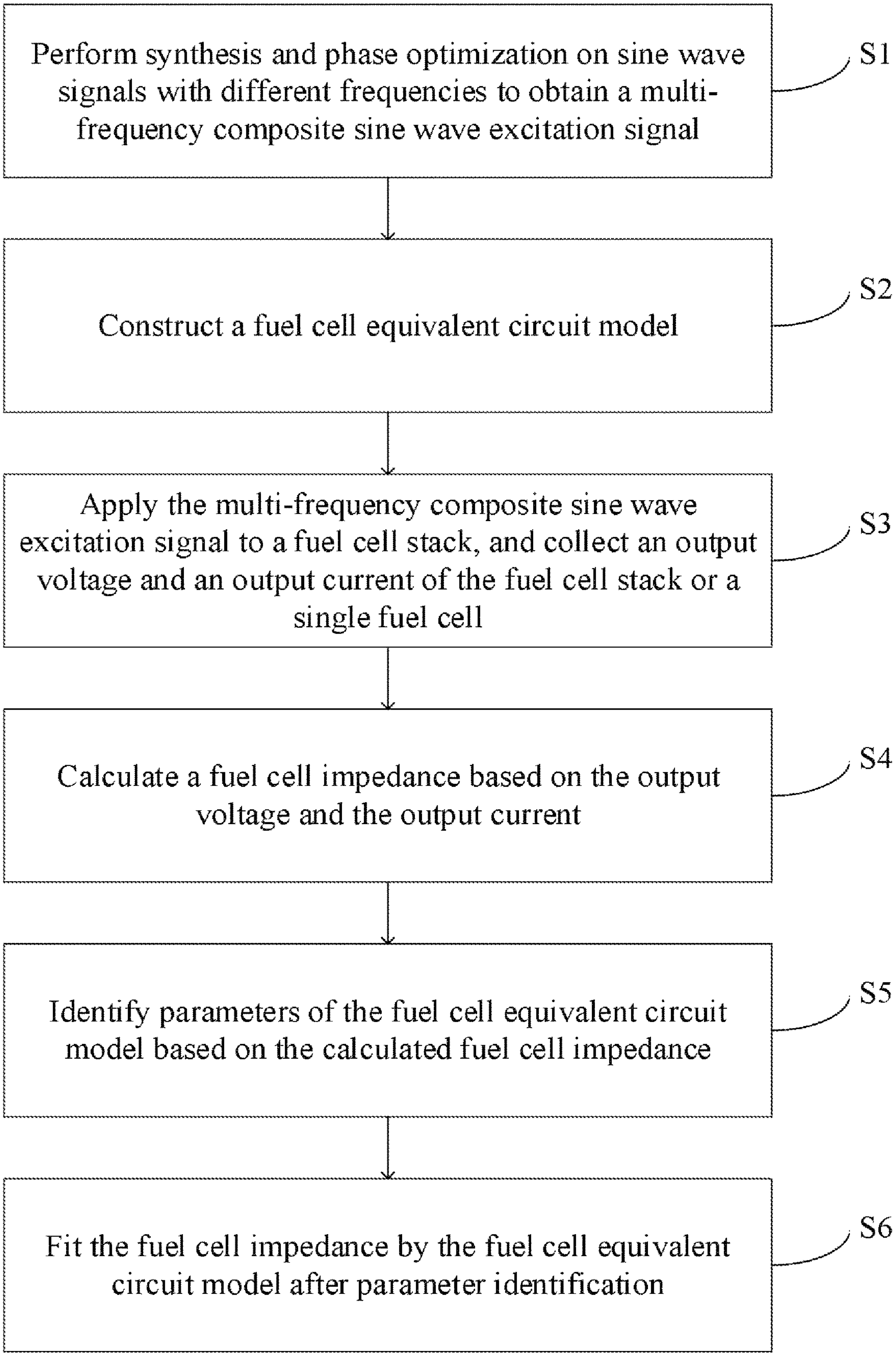
FIG. 2 is a flow chart of an on-line measurement method of an alternating current impedance of a vehicle-mounted fuel cell according to Embodiment 2 of the present disclosure.
Figure 3A:
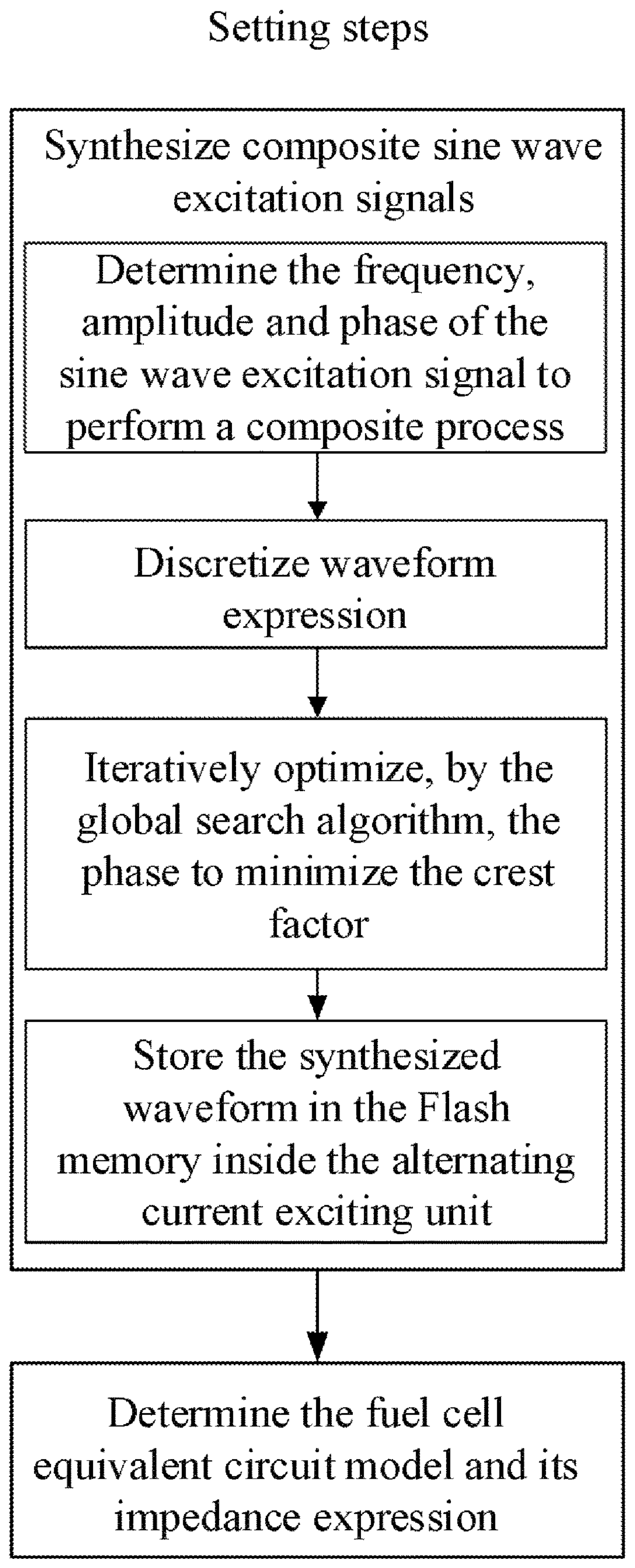
FIG. 3A-3B are setting and measuring flow charts of an on-line measurement method of an alternating current impedance of a vehicle-mounted fuel cell according to Embodiment 2 of the present disclosure.
Figure 3B:
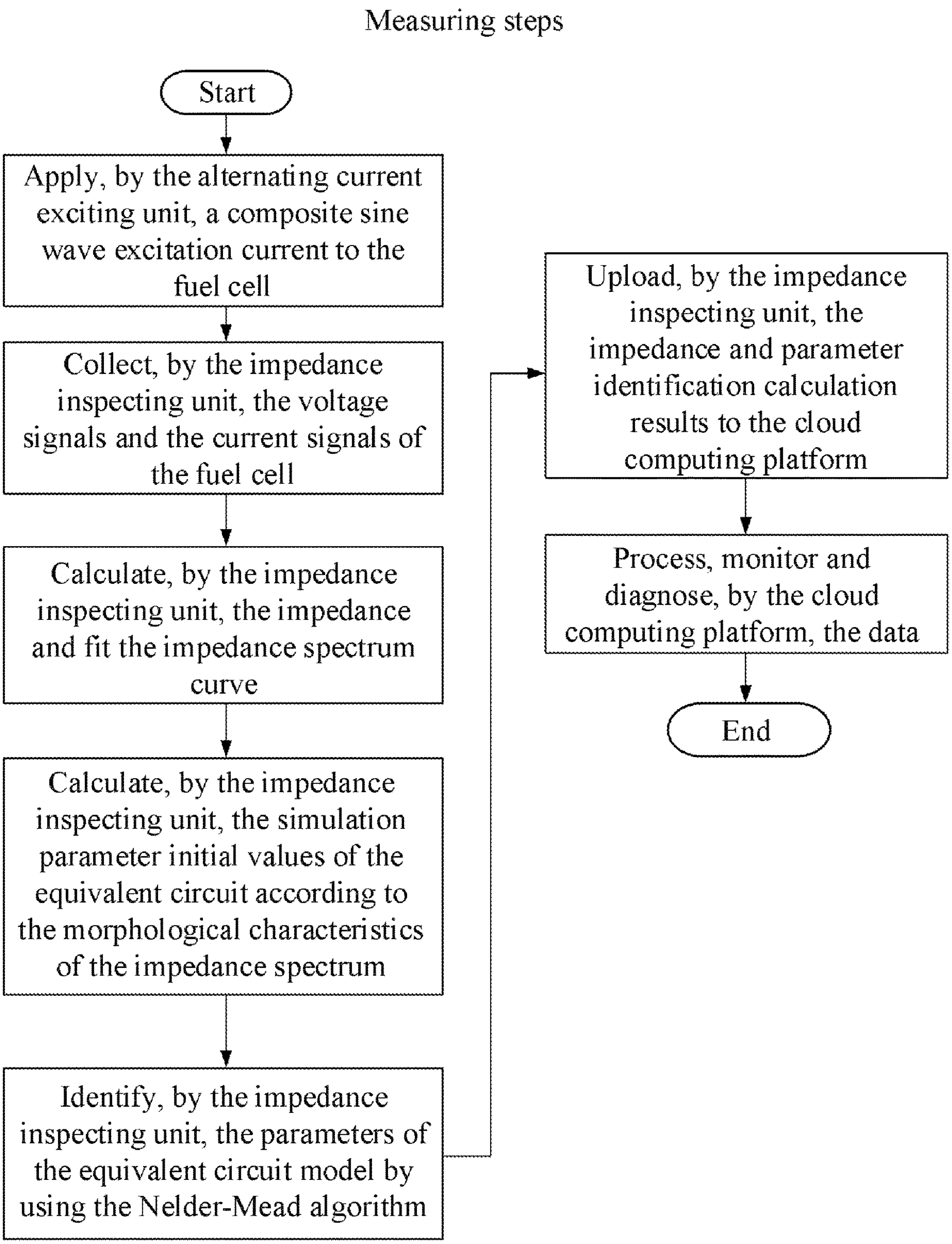

In order to implement the system corresponding to Embodiment 1 described above, so as to realize the corresponding functions and technical effects, an on-line measurement method of an alternating current impedance of a vehicle-mounted fuel cell is provided hereinafter, which includes setting and measuring steps, as shown in FIGS. 2-3B. The specific process is as follows.

Setting Steps:

In S1, synthesis and phase optimization are performed on sine wave signals with different frequencies to obtain a multi-frequency composite sine wave excitation signal.

The amplitude of a single sine wave that synthesizes the multi-frequency composite sine wave excitation signal is 5% to 10% of the output DC current of the fuel cell. The phase optimization is to minimize the crest factor and iterate by the global search algorithm to avoid the superposition of crests, including the following steps S11-S13.

In S11, the frequency $f_k$, the initial phase $\varphi_k$ and the amplitude $a_k$ of the sine wave signal to be subjected to a composite process are input into the computer, where $k=1, \ldots, K$, K is the number of the sine wave signals to be subjected to a composite process. In this embodiment, with the DC current 100 A as an example, the amplitude $a_k$ of a single sine wave that is synthesized to the multi-frequency composite sine wave current excitation signal is set as 10% of the output DC current of the fuel cell, and it is determined that the frequency of the sine wave signal to be subjected to a composite process is $f_k$=[2,4,8,20,40,80,100,250,500, 1250,2000] and the initial phase $\phi_k^0$ is 0, k=1, . . . , K, K=11.

In S12, the expression of the initial waveform after being subjected to a composite process is $$x^0(t)=\sum_{k=1}^{K} a_k\cos\left(2\pi f_k t+\varphi_k^0\right),$$

and the continuous time t is discretized to obtain $$x^0(n)=\sum_{k=1}^{K} a_k\cos\left(2\pi f_k n/N+\varphi_k^0\right),$$

where n=0, 1, . . . , N−1. N is a discrete sampling rate, and N=20000. The discrete sampling rate N is not less than 64 times of the highest frequency $f_k$.

In S13, an initial phase is iteratively optimized by a global search algorithm, and a phase value $\varphi_k^{best}$ of each frequency point that minimizes a crest factor CF is determined as a final optimized phase value. The global search algorithm can be a genetic algorithm. The formula for calculating the crest factor CF is:

$$CF^i=\frac{\left(\max\left(x^i(n)\right)-\min\left(x^i(n)\right)\right)}{2E_{eff}}$$

$$\text{where } E_{eff}=\sqrt{\frac{\Sigma_{k=1}^{K} a_k^{\,2}}{2}}$$

where i=0, 1, . . . , X, X is the total number of iterations.

Figure 5A:
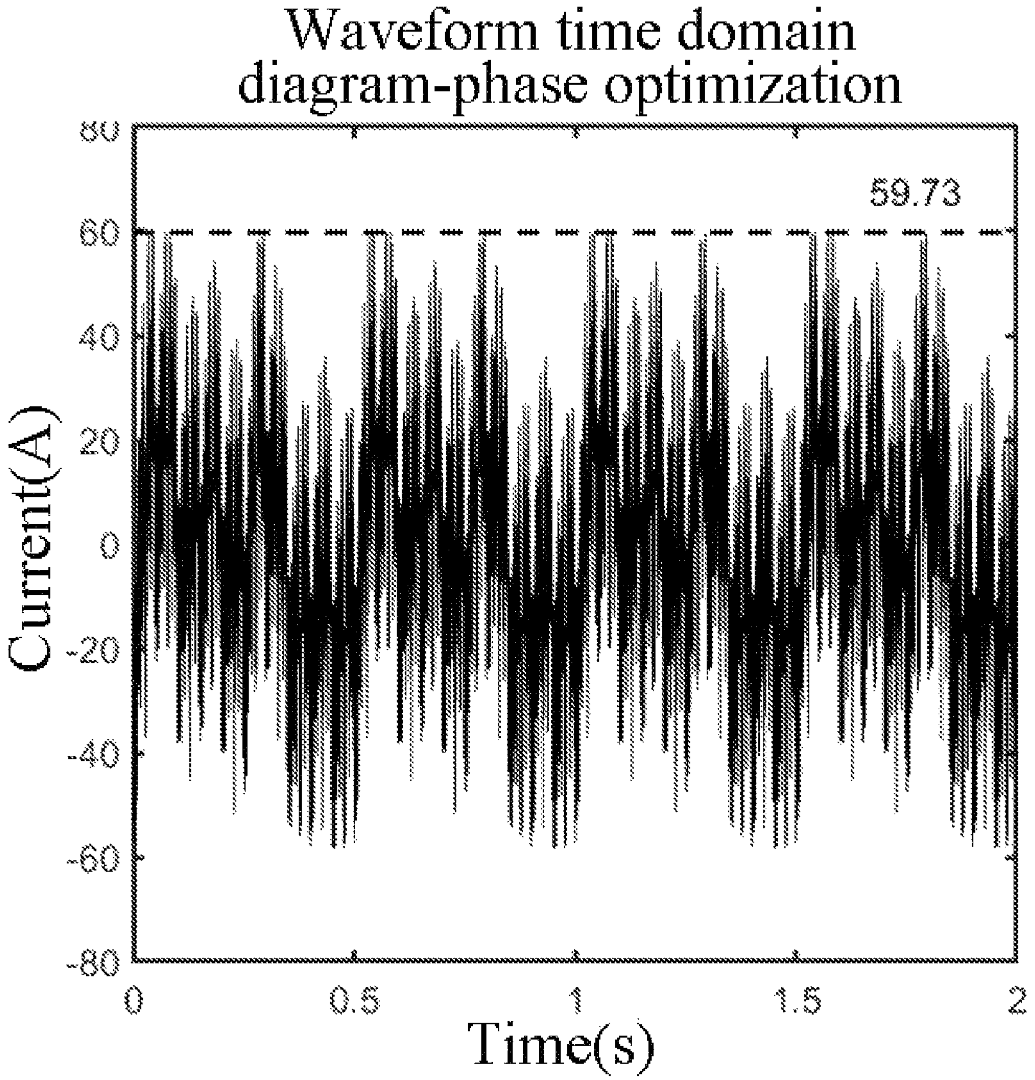
FIGS. 5A-5B are schematic diagrams of a phase optimization result of a synthesized composite sine wave signal.
Figure 5B:
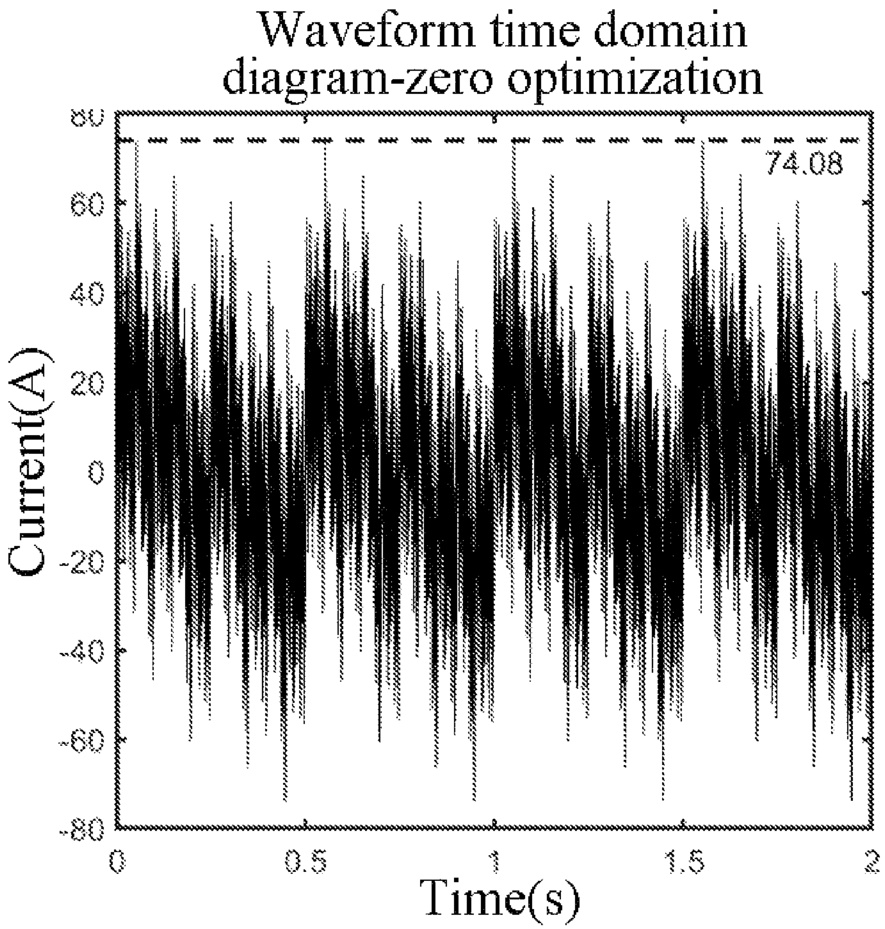

FIG. 5A shows the time-domain composite sine wave optimized by the genetic algorithm in MATLAB, and FIG. 5B shows the waveform before optimization. The crest factor decreases from 3.519 to 2.513. It can be seen that the crest value of the optimized waveform is obviously reduced.

In S2, a fuel cell equivalent circuit model is constructed.

The fuel cell equivalent circuit model is a second-order RC model, and consists of an ohmic resistor $R_0$ and two RC links connected in series. The impedance expression is:

$$Z=R_0+\frac{R_1\dfrac{1}{j\omega C_1}}{R_1+\dfrac{1}{j\omega C_1}}+\frac{R_2\dfrac{1}{j\omega C_2}}{R_2+\dfrac{1}{j\omega C_2}}$$

where the imaginary part is:

$$Z_{imag}=-\frac{R_1^2\omega C_1}{R_1^2\omega^2C_1^2+1}+\frac{R_2^2\omega C_2}{R_2^2\omega^2C_2^2+1}$$

the real part is:

$$Z_{real}=R_0+\frac{R_1}{R_1^2\omega^2C_1^2+1}+\frac{R_2}{R_2^2\omega^2C_2^2+1}$$

Measuring Steps:

In S3, the multi-frequency composite sine wave excitation signal is applied to a fuel cell stack, and an output voltage and an output current of the fuel cell stack or a single fuel cell are collected.

In S4, a fuel cell impedance is calculated based on the output voltage and the output current.

The sampling frequency of the output voltage and the output current is $f_s$. The total number of sampling points is M, and the complete cycle is obtained by sampling M points. According to the frequency of the original excitation signal frequency, the sampling frequency is divided. For signals with the original signal frequency not less than 80 Hz, the corresponding sampling frequency is $f_{s1}$=20 kHz, and for signals with the original signal frequency less than 80 Hz, the corresponding sampling frequency is $f_{s2}$=200 Hz. The total number of sampling points M is 2000. The first purpose of division is to ensure that the sampling theorem $f_s \geq 2f_k$. In fact, $f_s$ should generally be greater than 4 times of $f_k$. The second purpose of division is that the number of sampling cycles is enough, and the complete cycle is obtained by sampling, so as to ensure the accuracy of subsequent calculation. The collected voltage signal sequence is filtered as U (m), and the current signal sequence is filtered as I(m), where m=0, . . . , M−1. The specific calculation steps of the fuel cell impedance are as follows.

In S41, the collected current signal and voltage signal are calculated in real time by an orthogonal digital phase-lock amplifier, respectively, a time domain signal is converted into a frequency domain signal, and the amplitude and the phase corresponding to the current at different frequencies and the amplitude and the phase corresponding to the voltage at different frequencies are obtained.

The specific calculation steps of the orthogonal digital phase-lock amplifier are as follows.

In S411, in-phase reference signals are generated for sine waves with different frequencies:

$$A_k(m)=a_k\cos\left(\frac{2\pi f_k}{f_s}m+\phi_k\right)$$

Orthogonal reference signals are generated for sine waves with different frequencies, respectively:

$$B_k(m)=a_k\sin\left(\frac{2\pi f_k}{f_s}m+\phi_k\right)$$

The signals are stored in the Flash memory in the impedance inspecting unit.

In S412, cross-correlation operation is performed on the voltage signal sequence and the discrete sequence of in-phase reference signals with different frequencies, respectively, and the calculation formula is as follows:

$$R_{UA_k}=\frac{1}{M}\sum_{m=0}^{M-1}U(m)A_k(m)$$

Cross-correlation operation is performed on the current signal sequence and the discrete sequence of in-phase reference signals with different frequencies, respectively, and the calculation formula is as follows:

$$R_{IA_k} = \frac{1}{M}\sum_{m=0}^{M-1} I(m)A_k(m)$$

In S413, cross-correlation operation is performed on the voltage signal sequence and the discrete sequence of orthogonal reference signals with different frequencies, respectively, and the calculation formula is as follows:

$$R_{UB_k} = \frac{1}{M}\sum_{m=0}^{M-1} U(m)B_k(m)$$

Cross-correlation operation is performed on the current signal sequence and the discrete sequence of orthogonal reference signals with different frequencies, respectively, and the calculation formula is as follows:

$$R_{IB_k} = \frac{1}{M}\sum_{m=0}^{M-1} I(m)B_k(m)$$

In S414, the amplitude of the voltage response of the fuel cell at different frequencies is calculated as follows:

$$U_k = \frac{\sqrt{R_{UA_k}{}^2 + R_{UB_k}{}^2}}{2}$$

The phase difference is:

$$\phi_{Uk} = \arctan\left(\frac{R_{UB_k}}{R_{UA_k}}\right)$$

The amplitude of the current response of the fuel cell at different frequencies is calculated as follows:

$$I_k = \frac{\sqrt{R_{IA_k}{}^2 + R_{IB_k}{}^2}}{2}$$

The phase difference is:

$$\phi_{Ik} = \arctan\left(\frac{R_{IB_k}}{R_{IA_k}}\right)$$

In S42, the fuel cell impedance at different frequencies is calculated and the impedance spectrum curve is fitted. The formula for calculating the fuel cell impedance at different frequencies is as follows:

$$Z_k = \frac{U_k}{I_k}\cos(\phi_{Uk} - \phi_{Ik}) + j\frac{U_k}{I_k}\sin(\phi_{Uk} - \phi_{Ik})$$

In S5, a parameter of the fuel cell equivalent circuit model is identified based on the calculated fuel cell impedance.

In S51, an impedance spectrum curve is drawn by cubic spline fitting based on the calculated fuel cell impedance, and the initial value of the parameter of the equivalent circuit model is calculated in real time by the arc characteristics of the curve.

Figure 4:
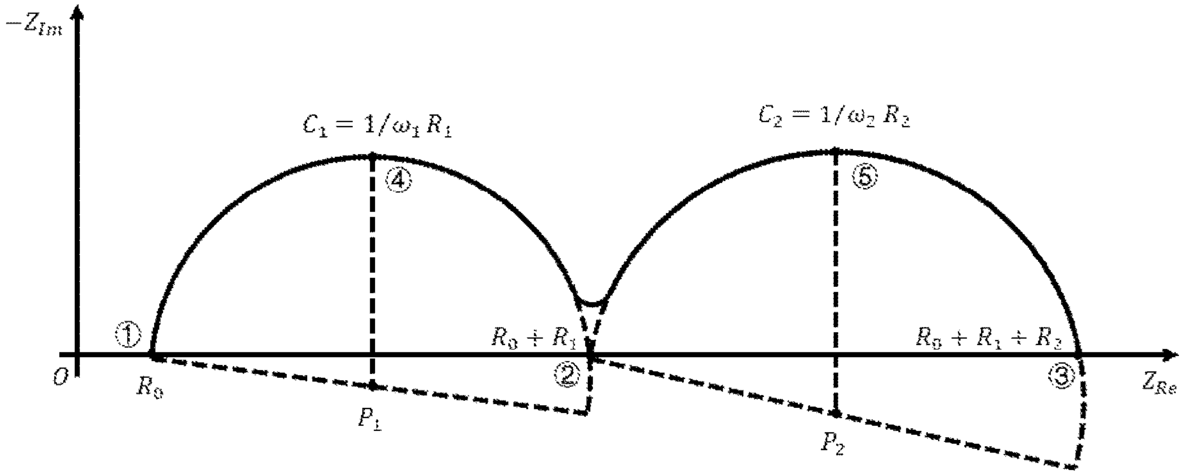
FIG. 4 is a schematic diagram of the corresponding relationship between initial values of parameters of an arc characteristic equivalent circuit model of an impedance spectrum curve.

The selection of initial values directly affects the results of subsequent parameter identification algorithms. If the initial values are not selected properly, the algorithm will easily fall into the local optimal solution. The relationship between the arc characteristics of the impedance spectrum curve and the initial value of the parameter of the equivalent circuit model determined in step S2 is shown in FIG. 4. In FIG. 4, point 1 is the intersection of the high-frequency impedance and the real axis, which corresponds to the ohmic impedance $R_0{}^0$; point 2 is the intersection of the right side of the high-frequency arc of the impedance spectrum and the real axis, which corresponds to $R_0{}^0+R_1{}^0$; point 3 is the intersection of the low-frequency arc of the impedance spectrum and the real axis, which corresponds to $R_0{}^0+R_1{}^0+R_2{}^0$; point 4 is the highest point of the high-frequency arc and its corresponding frequency is $\omega_1$, so $C_1{}^0=1/\omega_1 R_1{}^0$; and point 5 is the highest point of the low-frequency arc and its corresponding frequency is $\omega_2$, so $C_2{}^0=1/\omega_2 R_2{}^0$.

In S52, based on the initial value determined in the previous step S51, the parameter of the equivalent circuit model is identified in real time by using the Nelder-Mead simplex algorithm, so that the impedance of the equivalent circuit model determined in step S2 can fit the measured impedance data.

The Nelder-Mead simplex algorithm is a direct search method for multi-dimensional unconstrained minimization, and the minimization objective function is:

$$S(\vec{p}) = \sum_{k=1}^{K}\left[F_r(Z_{kreal} - Z_{kreal}')^2 + F_i(Z_{kimag} - Z_{kimag}')^2\right]$$

where $F_r$ and $F_i$ are error weights, $Z_{kreal}$ and $Z_{kimag}$ are the real part and the imaginary part of the measured impedance, and $Z_{kreal}'$ and $Z_{kimag}'$ are the real part and the imaginary part of the estimated impedance of the equivalent circuit model determined in step S2.

The specific calculation steps are as follows.

In S521, an initial simplex is constructed. Because there are five parameters to be identified, the initial simplex consists of six points $\vec{p_0}$, $\vec{p_1}$, $\vec{p_2}$, $\vec{p_3}$, $\vec{p_4}$ and $\vec{p_5}$ in a five-dimensional space, and satisfies:

$$\det\begin{bmatrix} \vec{p_0} & \vec{p_1} & \vec{p_2} & \vec{p_3} & \vec{p_4} & \vec{p_5} \\ 1 & 1 & 1 & 1 & 1 & 1 \end{bmatrix} \neq 0$$

where $\vec{p_0}$ is determined by step S51, and the remaining points are generated according to the following formula:

$$\vec{p_1} = \vec{p_0} + \lambda_i \vec{e_1}, i = 1, 2, \ldots, 5$$

where $\vec{e_1}$ is a set of unit vectors in the five-dimensional space, which is the standard basis of the space $\mathbb{R}^5$. The coefficient $\lambda_i$ is positive, which can be determined according to the scale of the optimization problem. In this embodiment, $\lambda_i$ is 1.6.

In S522, the objective function values $S(\vec{p_i})$ are calculated for six points, and are sorted according to the ascending order of the objective function values S:

$$S(\vec{p_0}) \le S(\vec{p_1}) \le S(\vec{p_2}) \le S(\vec{p_3}) \le S(\vec{p_4}) \le S(\vec{p_5})$$

The worst point is $\vec{p_5}$. After deducting $\vec{p_5}$, the center of gravity $\vec{p_g}$ of the remaining five points is calculated. The calculation formula is as follows:

$$\vec{p_g} = \sum_{i=0}^{5} \frac{\vec{p_i}}{5}$$

In S523, the worst point $\vec{p_5}$ is reflected in the direction of $\vec{p_g}$ by using the reflection coefficient $\rho>0$ to obtain a reflection point $\vec{p_r}$:

$$\vec{p_r} = \vec{p_g} + \rho(\vec{p_g} - \vec{p_5})$$

The reflection coefficient is $\rho=1$, and the objective function value $S(\vec{p_r})$ of the reflection point is calculated.

In S524, if $S(\vec{p_0}) \le S(\vec{p_r}) < S(\vec{p_4})$, the old $\vec{p_5}$ is replaced with $\vec{p_r}$ to construct a new simplex, completing this reflection operation, and jumping to step S529.

In S445, if $S(\vec{p_r}) \le S(\vec{p_0})$, an extension operation is performed in the direction of $\vec{p_r}$ to obtain an extension point $\vec{p_e}$:

$$\vec{p_e} = \vec{p_g} + \chi(\vec{p_r} - \vec{p_g})$$

$\chi>1$ is the extension coefficient, $\chi=2$ is taken to calculate the objective function value $S(\vec{p_e})$ of the extension point. If $S(\vec{p_e}) < S(\vec{p_r})$, the old $\vec{p_5}$ is replaced with $\vec{p_e}$ to construct a new simplex, completing this reflection operation, and jumping to step S449. If $S(\vec{p_e}) \ge S(\vec{p_r})$, the old $\vec{p_5}$ is replaced with $\vec{p_r}$ to construct a new simplex, completing this reflection operation, and jumping to step S529.

In S526, if $S(\vec{p_4}) \le S(\vec{p_r}) < S(\vec{p_5})$, a contraction point $\vec{p_c}$ is obtained by external contraction:

$$\vec{p_c} = \vec{p_g} + \gamma(\vec{p_r} - \vec{p_g})$$

$0<\gamma<1$ is the contraction coefficient, $\gamma=0.5$ is taken to calculate the objective function value $S(\vec{p_c})$ of the contraction point, jumping to step S528.

In S527, if $S(\vec{p_r}) \ge S(\vec{p_5})$, internal contraction is performed to obtain the contraction point $\vec{p_c}$:

$$\vec{p_c} = \vec{p_g} + \gamma(\vec{p_5} - \vec{p_g})$$

$0<\gamma<1$ is the contraction coefficient, $\gamma=0.5$ is taken to calculate the objective function value $S(\vec{p_c})$ of the contraction point, jumping to step S528.

In S528, if $S(\vec{p_c}) \le S(\vec{p_5})$, the old $\vec{p_5}$ is replaced with $\vec{p_c}$ to construct a new simplex, jumping to step S449. If $S(\vec{p_c}) > S(\vec{p_5})$, which means that the contraction failed, compression operation is performed, in which only $\vec{p_0}$ is kept and the distance between other points in the simplex and $\vec{p_0}$ is halved to construct a new simplex:

$$\vec{v_i} = \vec{p_0} + \sigma(\vec{p_i} - \vec{p_0}),\ i = 1, 2, \ldots, 5$$

$\sigma=0.5$ is the compression coefficient, jumping to step S529.

In S529, it is determined whether the convergence condition as follows is met:

$$\sqrt{\frac{1}{6}\sum_{i=0}^{5}\left[S(\vec{p_i}) - S(\vec{p_g})\right]^2} \le \varepsilon$$

and if the convergence condition is met, the iteration is stopped. $\varepsilon$ is the convergence condition, $\varepsilon=0.00001$ is taken, and the output $\vec{p_5}$ is the final parameter identification result. Otherwise, the iteration continues, and step S522 is performed.

In S6, the fuel cell impedance is fitted by the fuel cell equivalent circuit model after parameter identification.

Figure 6:
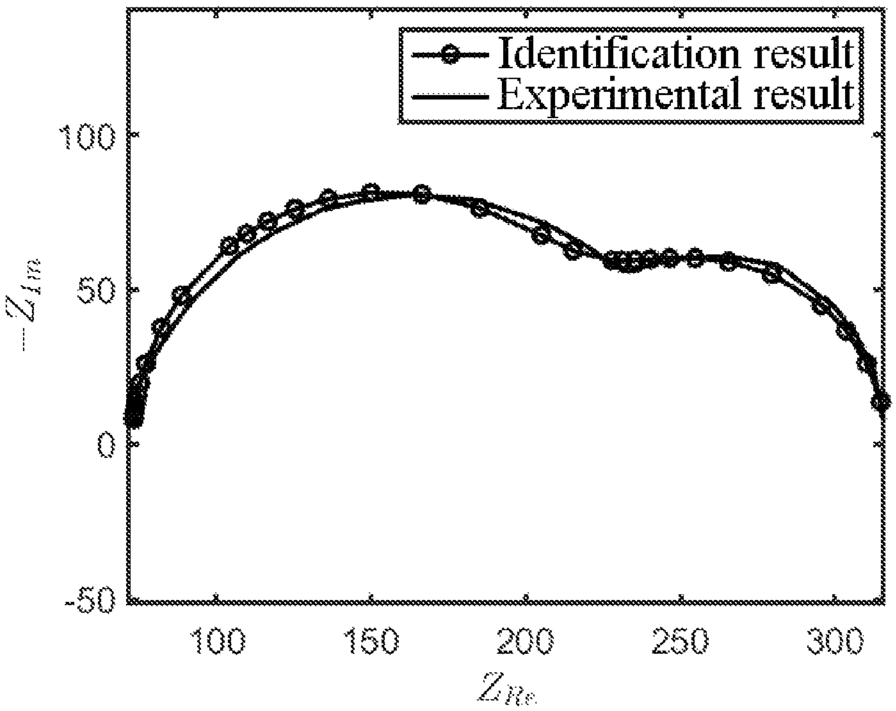
FIG. 6 is a schematic diagram of a fitting result of parameter identification of a fuel cell equivalent circuit model.

After the iteration is stopped, the impedance spectrum of the equivalent circuit model is drawn according to the final parameter identification result $\vec{p_5}$ and compared with the original fuel cell impedance data. The result is shown in FIG. 6. It can be seen that the identified equivalent circuit model parameters have a good fitting effect on the fuel cell impedance.

The on-line measurement method of the alternating current impedance of the vehicle-mounted fuel cell according to the present disclosure uses a multi-frequency composite sine wave as an excitation signal, to reduce the time consumption of impedance spectrum measurement, ensure that the impedance data measured each time at different frequencies are at the same time, optimize the phase of the sine wave signal of each frequency component by using a global search algorithm, reduce the crest value of the composite signal, and alleviate the influence of non-linearity of the fuel cell system. The orthogonal digital phase-lock amplifier is used to process the collected voltage and current signals from time domain to frequency domain, which saves computational resources and realizes on-line application in vehicles. The initial value of the parameter of the equivalent circuit model is calculated by the arc characteristics of the impedance spectrum, and then the parameter of the fuel cell equivalent circuit model is identified by the Nelder-Mead simplex algorithm which needs no derivation and is easy to calculate, which reduces the calculation difficulty, and realizes on-line application in vehicles.

In this specification, embodiments are described in a progressive way. Each embodiment focuses on the difference from other embodiments, and the same and similar parts of various embodiments can be referred to each other.

In the specification, some specific embodiments are used for illustration of the principles and implementations of the present disclosure. The description of the above embodiments is only used to help illustrate the method and core ideas of the present disclosure. In addition, those skilled in the art can make various modifications in terms of specific implementations and application scope in accordance with the ideas of the present disclosure. To sum up, the contents of the specification should not be construed as limiting the present disclosure.

What is claimed is:

1. An on-line measurement system of an alternating current impedance of a vehicle-mounted fuel cell, comprising an impedance measuring group; wherein the impedance measuring group comprises:

an alternating current exciting unit, configured to apply a multi-frequency composite sine wave excitation signal to a fuel cell stack, wherein the multi-frequency composite sine wave excitation signal is obtained by performing phase optimization and synthesis on sine wave signals with different frequencies; wherein the alternating current exciting unit comprises:

a Flash memory, configured to store the multi-frequency composite sine wave excitation signal;

a sine pulse width modulation unit, connected with the Flash memory and configured to control an output of the multi-frequency composite sine wave excitation signal; and a full-bridge topology circuit, connected with the sine pulse width modulation unit and configured to apply the output multi-frequency composite sine wave excitation signal to the fuel cell stack;

a current sensor, arranged on an output trunk of the fuel cell stack and configured to collect an output current of the fuel cell stack or a single fuel cell;

an impedance inspecting unit, connected with the fuel cell stack and the current sensor, respectively, and configured to collect an output voltage of the fuel cell stack or the single fuel cell, calculate a fuel cell impedance according to the output voltage and the output current, and identify a parameter of a pre-constructed fuel cell equivalent circuit model based on the calculated fuel cell impedance, wherein the fuel cell equivalent circuit model after parameter identification is configured to fit the fuel cell impedance.

2. The system according to claim 1, further comprising a cloud computing platform in wireless communication with the impedance measuring group, wherein the cloud computing platform is configured to receive and store the parameter of the fuel cell equivalent circuit model and the fitted fuel cell impedance, and evaluate a health status of the fuel cell and diagnose a fault of the fuel cell by using a clustering algorithm based on the fitted fuel cell impedance.

3. The system according to claim 1, wherein the impedance inspecting unit comprises:

a relay switch, connected with the fuel cell stack and configured to select an inspecting channel and collect the output voltage of the fuel cell stack or the single fuel cell;

a first differential amplifier, connected with an output end of the relay switch and configured to eliminate a common-mode voltage;

a second differential amplifier, connected with an output end of the current sensor and configured to eliminate a common-mode current;

an analog-to-digital converter, connected with an output end of the first differential amplifier and an output end of the second differential amplifier, respectively, and configured to convert an analog signal into a digital signal; and a digital signal processor, connected with an output end of the analog-to-digital converter and configured to calculate the fuel cell impedance according to the converted output voltage and output current, and identify the parameter of the pre-constructed fuel cell equivalent circuit model based on the calculated fuel cell impedance.

4. An on-line measurement method of an alternating current impedance of a vehicle-mounted fuel cell, wherein the on-line measurement method is applied to the on-line measurement system of the alternating current impedance of the vehicle-mounted fuel cell according to claim 1, and the on-line measurement method comprises:

performing synthesis and phase optimization on sine wave signals with different frequencies to obtain a multi-frequency composite sine wave excitation signal, comprising:

performing a composite process on the sine wave signals with different frequencies; and for the composite sine wave signals, iteratively optimizing an initial phase by a global search algorithm, and determining a phase value of each frequency point that minimizes a crest factor CF as a final optimized phase value;

constructing a fuel cell equivalent circuit model;

applying the multi-frequency composite sine wave excitation signal to a fuel cell stack, and collecting an output voltage and an output current of the fuel cell stack or a single fuel cell;

calculating a fuel cell impedance based on the output voltage and the output current;

identifying a parameter of the fuel cell equivalent circuit model based on the calculated fuel cell impedance; and fitting the fuel cell impedance by the fuel cell equivalent circuit model after parameter identification.

5. The method according to claim 4, wherein after fitting the fuel cell impedance by the fuel cell equivalent circuit model after parameter identification, the method further comprises:

storing the parameter of the fuel cell equivalent circuit model and the fitted fuel cell impedance; and based on the fitted fuel cell impedance, evaluating a health status of the fuel cell and diagnosing a fault of the fuel cell by using a clustering algorithm.

6. The method according to claim 4, wherein the fuel cell equivalent circuit model is a second-order RC model, and consists of an ohmic resistor and two RC links connected in series.

7. The method according to claim 4, wherein calculating the fuel cell impedance based on the output voltage and the output current comprises:

calculating the output voltage and the output current in real time by an orthogonal digital phase-lock amplifier, respectively, converting a time domain signal into a frequency domain signal, and obtaining a current amplitude and a current phase corresponding to the output current at different frequencies and a voltage amplitude and a voltage phase corresponding to the output voltage at different frequencies; and calculating fuel cell impedances at different frequencies based on the current amplitude, the current phase, the voltage amplitude and the voltage phase.

8. The method according to claim 4, wherein identifying the parameter of the fuel cell equivalent circuit model based on the calculated fuel cell impedance comprises:

based on the calculated fuel cell impedance, calculating an initial value of the parameter of the fuel cell equivalent circuit model by an arc characteristic of an impedance spectrum curve; and based on the initial value of the parameter, identifying the parameter of the fuel cell equivalent circuit model by using a Nelder-Mead simplex algorithm.

* * * * *